United States Patent [19]

Lendaro

[11] Patent Number: 5,317,470

[45] Date of Patent: May 31, 1994

[54] CONTROL SYSTEM INCLUDING A SWITCHING CIRCUIT FOR ENSURING PROPER OPERATION WHEN OPERATING POWER IS REMOVED FROM A PORTION OF THE CONTROL SYSTEM

[75] Inventor: Jeffery B. Lendaro, Noblesville, Ind.

[73] Assignee: Thomson Consumer Electronics, Inc., Indianapolis, Ind.

[21] Appl. No.: 695,807

[22] Filed: May 6, 1991

[51] Int. Cl.$^5$ ............................................. H02H 3/24
[52] U.S. Cl. ...................................... 361/92; 361/79
[58] Field of Search .................... 361/92, 90, 91, 71, 361/78, 79; 358/188, 194.1, 209, 210

[56] References Cited

U.S. PATENT DOCUMENTS

| | | | |
|---|---|---|---|
| 4,527,194 | 7/1985 | Sirazi | 358/86 |
| 4,532,457 | 7/1985 | Haferl | 315/411 |
| 4,668,932 | 5/1987 | Drori et al. | 338/48 |
| 5,029,005 | 7/1991 | Morris, Jr. | 358/165 |

Primary Examiner—Steven L. Stephan
Assistant Examiner—Matthew Nguyen
Attorney, Agent, or Firm—Joseph S. Tripoli; Peter M. Emanuel

[57] ABSTRACT

An arrangement for ensuring that a proper control level for a controlled unit is maintained when a supply voltage is removed from a control unit of a control system includes a switching circuit coupled between the control unit and the controlled unit. The controlled unit couples the control signal generated by the control unit to the controlled unit when the supply voltage is present and is responsive to the absence of the supply voltage for decoupling the output of the controlling unit from the input of the controlled unit. In this manner, a current path established by a protection circuit within the control unit when the supply voltage is removed is decoupled from the controlled unit and does not adversely affect the operation of the controlled unit.

2 Claims, 2 Drawing Sheets

CONTROL SYSTEM INCLUDING A SWITCHING CIRCUIT FOR ENSURING PROPER OPERATION WHEN OPERATING POWER IS REMOVED FROM A PORTION OF THE CONTROL SYSTEM

FIELD OF THE INVENTION

The invention concerns an arrangement for ensuring that proper logic levels are maintained when operating power is removed from a portion of a control system.

BACKGROUND OF THE INVENTION

Digital control systems are commonly employed in modern electronic equipment such as consumer products. Frequently, a software controlled microprocessor is the core of such a digital control system and controls various portions of the equipment through a common data bus. Peripheral control units may be coupled between the data bus and the controlled sections and are controlled by the microprocessor and in turn control the control units. A peripheral control unit may serve as a buffer between logic circuitry of the microprocessor and analog circuitry, such as a switch, of the controlled unit. In addition, a microprocessor has a limited number of input and output (called I/O) terminals. A peripheral control unit which has a number of I/O terminals can be used to increase the number of controlled units which can be used to increase the number of controlled units which can be controlled by the microprocessor and is therefore sometimes referred to an "I/O expander".

Commonly in electronic equipment, the control system is coupled to a "standby" power supply which continues to supply operating power even when the the equipment is "off". This allows status information to be maintained while the equipment is "off" and in consumer equipment, such as a television receiver, it allows a remote control command for turning the receiver "on" to be received and processed. While it is desirable that the control system be supplied with standby operating power, it is not always desirable or possible for the entire control be provided with standby operating power. For example, when a large number of peripheral control units are utilized, there may be an excessively heavy load on the standby power supply. For this reason or because of the specific configuration of the equipment, one or more peripheral control units may receive operating power from a power supply, sometimes called a "run power supply, which is turned "off" when the equipment is turned "off".

In certain equipment, the controlled unit is continuously supplied with operating power even while the equipment is off. For example, in an audio system, an audio power amplifier may continually receive operating power to avoid the need for a high power switch. In such arrangements, it is desirable to mute the power amplifier when the receiver is "off" in order to avoid the generation of audible noises. Turning off the power supply for a peripheral control unit which controls such a controlled unit may cause the controlled unit to operate improperly (for example, to not be "muted") when the equipment is turned off. This problem may be more fully understood with reference to FIG. 1.

As is shown in FIG. 1, a peripheral control unit integrated circuit (IC) 100 receives control data from a microprocessor IC 200 via a data bus 300 and in turn generates a control signal for a controlled unit 400. Peripheral control unit 100 may comprise an I/O bus expander. Data bus 300 may, for example, be of the well known two-wire I²C type, including data and clock lines, which is described in detail in "Philips Technical Publication 110-I²C Bus in Consumer Applications", published by Philips Export B.V., The Netherlands in 1983. The control signal generated by peripheral control unit 200 is coupled to a switching circuit 500 associated with a particular function of controlled unit 400. For example, controlled unit 400 may include an audio power amplifier of a television receiver and switch 500 may be associated with the audio muting function of the audio power amplifier. While there may be various other peripheral control units associated with respective controlled units, these other units are not shown for the sake of simplicity.

Peripheral control unit IC 100 includes a data decoder and storage register section 101 and an output stage 103 including a field effect transistor (FET) Q1. A control signal generated and thereafter stored by decoder section 101 in response to data supplied by microprocessor 200 is coupled to the gate of FET Q1. The drain of FET Q1 is coupled to an output terminal of peripheral control unit IC 100 and to an internal current source 105. The source of FET Q1 is coupled to ground. A first protection diode D1 is coupled between the output terminal and the positive voltage supply rail and a second protection diode is coupled between the output terminal and the ground rail. Diode D1 protects FET Q1 against positive-going transients coupled to the output terminal by limiting the voltage developed at the drain to the positive supply voltage plus a diode voltage drop. Diode D2 protects FET Q1 against negative-going transients coupled to the output terminal by limiting the voltage developed at the drain to the ground potential minus a diode voltage drop.

Switch 500 comprises a voltage divider including resistors R1, R2 and R3 connected in series between a supply voltage rail and ground and a NPN transistor Q2. The control signal generated at the output terminal of peripheral control unit IC 100 is coupled the junction of resistors R1 and R2 and the junction of resistors R2 and R3 is coupled to the base of transistor Q2. The collector of transistor Q2 is connected to a load circuit (the input impedance of which is represented by a load resistor R4) within controlled unit 400 which controls the associated function. The emitter of transistor Q2 is connected to ground.

Microprocessor 200 is coupled to a standby power supply (not shown) which continues to supply a positive standby operating voltage (STANDBY) even when the equipment in which the arrangement shown in FIG. 1 is included is "off". Peripheral control unit 100 is coupled to a "run" power supply (not shown) which supplies a positive operating voltage (RUN 1) when the equipment is turned on and which is turned off when the equipment is turned off, as is symbolically indicated by switch SW. This feature reduces the power consumption of the standby power supply. It also eliminates the need to connect the standby power supply to various points throughout the equipment, which is particularly advantageous when the various peripheral control units are located near respective controlled unit and remote from microprocessor 200. Additionally, it eliminates the need for a standby power supply which provides a particular supply voltage required only by peripheral control unit 100. A resistor R5 represents various other loads, including other peripheral units, which receive the RUN 1 operating voltage. Load resistor R5 will be referred to later in connection with the description of a problem solved by the invention. Controlled unit 400 and switch 500 are coupled to another run power supply (not shown) which continually supplies another operating voltage (RUN 2) even when the equipment is off. The latter feature eliminates the need for a relatively expensive power switch.

The function of controlled unit 400 controlled by transistor Q2 is activated when FET transistor Q1 is non-conductive (cutoff) and NPN transistor Q2 is conductive (saturated). The function is inactivated when FET transistor Q1 is conductive (saturated) and NPN transistor Q2 is non-conductive (cutoff). In the example in which controlled unit includes an audio power amplifier of a television receiver and switch 500 controls the muting function of the audio power amplifier, the audio power amplifier is muted when FET transistor Q1 is non-conductive and NPN transistor Q2 is conductive. For example, the conduction of NPN transistor Q2 may cause a current source to be disabled from operating thereby turning the power amplifier off. It is desirable that the power amplifier be off when the receiver is off in order to mute unwanted audible responses due to electrical noise and also to reduce the power consumption of the receiver since controlled unit 400 is coupled to a run supply which continually supplies an operating voltage (RUN 2) even when the receiver is off. Such an arrangement is described in commonly assigned U.S. patent application Ser. No. 511,295, entitled "Apparatus for the Muting of an Audio Power Amplifier in a Standby Mode", filed in the name of R. E. Morris, Jr. on Apr. 25, 1990 and which was allowed on Dec. 10, 1990. To mute the power amplifier, transistor Q2 should be conductive when the receiver is off. However, protection diode D1 tends to prevent such desirable condition in the following way.

When the receiver is turned off, microprocessor 200 transmits control data for causing FET transistor Q1 of peripheral control unit 100 to be rendered non-conductive shortly before causing the switched power supplies of the receiver, including the one which supplies the RUN 1 supply voltage, to be turned off. NPN transistor Q2 is supposed to be rendered conductive when FET transistor Q1 is caused to be rendered non-conductive when the receiver is turned off and is supposed to remain conductive thereafter. The impedance presented at the output terminal of peripheral control unit 100 would remain high if supply voltage RUN 1 was maintained after the receiver was turned off. However, even though transistor Q1 presents a high impedance at the output terminal of peripheral control unit 100 after the RUN 1 supply voltage is removed, a relatively low impedance current path is presented at the output terminal in the following manner. When the RUN 1 supply voltage is decoupled from peripheral control unit 100, protection diode D1, which has its cathode coupled to ground through the various loads (R5) of the RUN1 power supply and its anode coupled to the RUN 2 power supply voltage through resistor R1, is forward biased in response to the RUN 2 supply voltage. As a result, a current path is established between the output terminal of peripheral control unit 100 and ground through now conductive protection diode D1 and load resistor R5. This current path tends to keep the base voltage of NPN transistor so low that it is not rendered conductive as desired. The impedance of the current path is dependent on the nature of the load represented by resistor R5 and is not readily predictable and controllable. Accordingly, it is difficult to select values of resistors R1, R2 and R3 which would compensate for the presence of the unwanted current path.

SUMMARY OF THE INVENTION

An aspect of the invention resides in the recognition of the above-described problem caused by a protection diode of a control unit when operating voltage is removed from it. Another aspect of the invention concerns the addition of a switching circuit which is coupled between the control unit and the controlled unit for selectively decoupling the protection diode from the controlled unit when the operating voltage is removed from the peripheral control unit in order to solve the problem. Still another aspect of the invention concerns the arrangement of such a switching circuit and which is responsive to the operating voltage of the control unit for permitting normal control operation while the operating supply voltage is provided and which decouples the control unit from the controlled unit when the operating voltage is removed.

These and other aspects of the invention will be described with reference to the accompany Drawing.

BRIEF DESCRIPTION OF THE DRAWING

In FIG. 2, the same or similar elements of the control system shown in FIGS. 1 are identified by the same reference designations.

DETAILED DESCRIPTION OF FIG. 2 OF THE DRAWING

Figure 1:
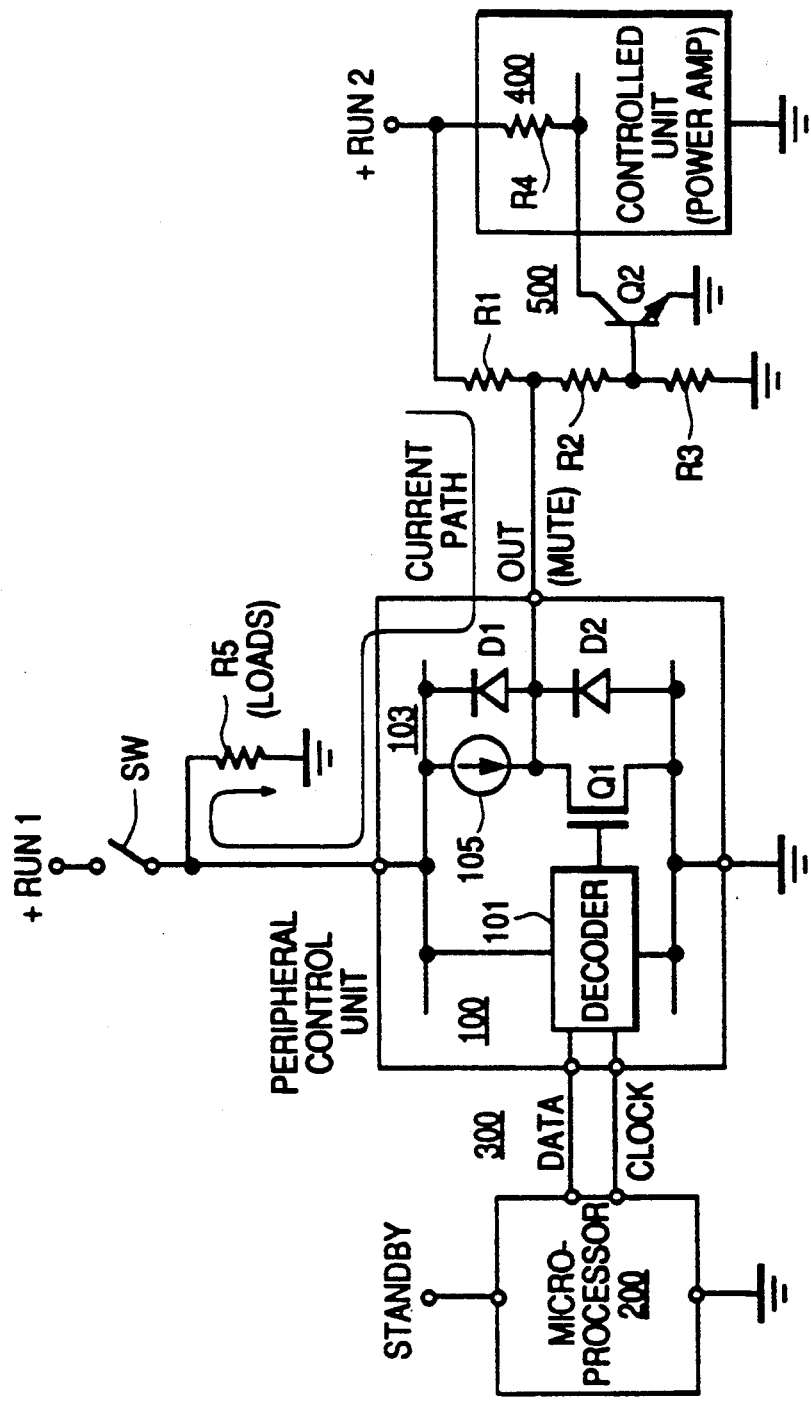
FIG. 1 is a schematic diagram of a control system which was previously described to facilitate an understanding of the problem solved by the invention.
Figure 2:
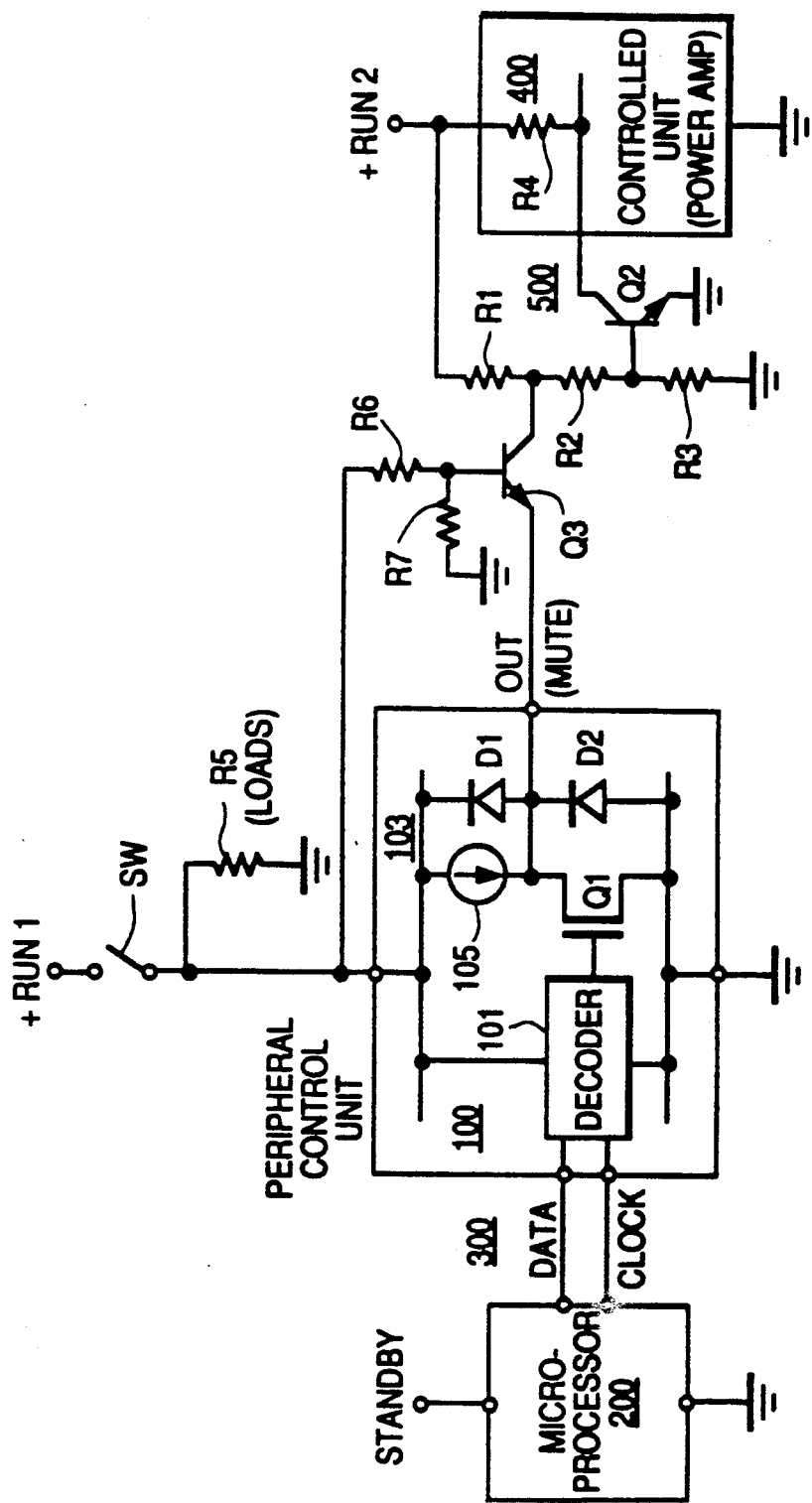
FIG. 2 is a schematic diagram of a control unit incorporating a preferred implementation of a switching circuit which is constructed in accordance with an aspect of the invention and which solves the problem present in the control system shown in FIG. 1.

The control system shown in FIG. 2 is the same as the one shown in FIG. 1, except that an additional switching circuit including a NPN transistor Q3 configured as a non-inverting buffer has been inserted between peripheral control unit 100 and switching circuit 500 associated with controlled unit 500. The emitter of transistor is coupled to the output terminal of peripheral control unit 100 and the collector of transistor Q3 is coupled to the junction of resistors R1 and R2 of switching circuit 500. The RUN 1 supply voltage, when present, is coupled to the base of transistor Q3 through a current limiting resistor R6. An optional resistor R7 may be coupled between the base of transistor Q3 and ground for the reason described below.

While the RUN 1 supply voltage is present when the equipment is on, if FET Q1 is caused to conduct (saturate) in response to data generated by microprocessor 200, the emitter of NPN transistor Q3 is pulled to ground through conductive FET Q1. As a result, the base-emitter junction of transistor Q3 is forward biased and transistor Q3 is caused to conduct (saturate) because the RUN 1 supply voltage is coupled to its base. In turn, transistor Q2 is rendered non-conductive (cutoff) and the associated function (muting) of controlled unit 400 is inactivated. If the FET Q1 is rendered non-conductive, the emitter of NPN transistor Q3 is pulled up toward the RUN 1 supply voltage through current source 101. As a result the base-emitter junction of transistor is reverse biased and transistor Q3 is rendered non-conductive (cutoff). In turn, transistor Q2 is rendered non-conductive (cutoff) and the associated function of controlled unit 400 is activated. Thus, the addition of switching transistor Q3 does not interfere with the normal control operation.

While the RUN 1 supply voltage is absent when the equipment is off, the base voltage of transistor Q3 is at ground potential and transistor Q3 is non-conductive (cut-off). As a result, protection diode D1 is decoupled from switching circuit 400 and the base voltage of transistor Q2 is allowed to assume the positive voltage provided at the junction resistors R1 and R2. As a result, transistor Q2 is conductive (saturated) and the associated function (muting) of controlled unit 400 is activated, as is desired.

It is noted that no unwanted transients are generated as the RUN 1 supply voltage drops. As was earlier described with reference to the example in which controlled unit comprises an audio power amplifier, it is desirable that the muting function be activated as the receiver is turned off to ensure that audible noise responses are not generated. For that purpose, microprocessor 200 transmits data to peripheral control unit 100 to cause FET transistor Q1 to be rendered non-conductive (cut-off) and NPN transistor Q2 to be rendered conductive (saturated) shortly before the switched power supplies, including the RUN 1 voltage supply, are caused to be turned off. The RUN 1 supply voltage does not fall instantaneously but rather falls gradually due to power supply filter capacitors (not shown). Transistor Q3 remains non-conductive as the RUN 1 supply falls because its base voltage follows the RUN1 supply voltage.

Optional resistor R7 may be added to establish a cutoff threshold for switching transistor Q3 relative to the RUN 1 supply voltage to inhibit transients due to erratic operation of peripheral control unit IC 100 as the RUN 1 supply voltage falls. For example, assume peripheral control unit IC were to exhibit erratic operation causing FET Q1 to be rendered conductive from the desired non-conductive state when the RUN 1 supply voltage fell to 2 volts. In that case, the ratio of resistors R6 and R7 could be selected to provide an insufficient base voltage, for example, 0.4 volts, to permit transistor Q3 to be rendered conductive when FET transistor Q1 was erratically caused to conduct at 2 volt level of the RUN 1 supply voltage.

While the present invention has been described with reference to a specific circuit configuration, it will be appreciated that modifications to suit other configurations may become apparent to those skilled in the art. Such modifications and others are intended to be within the scope of the invention defined by one or more of the following Claims.

I claim:

1. In an electronic equipment which may be turned "on" and "off", apparatus comprising:
    a controlled unit which receives a first supply voltage even when said equipment is "off" and which includes a control device for controlling a particular function of said controlled device in response to a control signal coupled to an input of said control device;
    a control unit which receives a second supply voltage only when said equipment is "on" and which generates said control signal at an output of said control unit only when said equipment is "on"; and
    a switch for coupling the control signal developed at said output of said control unit to said input of said control device when said second supply voltage is present and for decoupling said input of said control device from said output of said control unit when said second supply voltage is absent;
    said switch being responsive to the presence of said second supply voltage for coupling the control signal developed at said output of said control unit to said input of said control device and is responsive to the absence of said second supply voltage for decoupling said input of said control device from said output of said control unit;
    said switch including a transistor having first and second electrodes defining the ends of a conduction path and a control electrode for controlling the conduction state of said conduction path; said first electrode being coupled to said output of said control unit, said second electrode being coupled to said input of said control device and said second supply voltage being coupled to said control electrode.

2. In an electronic equipment which may be turned "on" and "off", apparatus comprising:
    a controlled unit which receives a first supply voltage even when said equipment is "off" and which includes a control device which also receives said first supply voltage even when the equipment is "off" and which controls a particular function of said controlled device in response to a control signal coupled to an input of said control device;
    a control unit which receives a second supply voltage only when said equipment is "on" and which generates said control signal at an output of said control unit only when said equipment is "on"; and
    a switch for coupling the control signal developed at said output of said control unit to said input of said control device in response to the presence of said second supply voltage and for decoupling said input of said control device from said output of said control unit in response to the absence of said second supply voltage; said switch having a first terminal, a second terminal and a control terminal for controlling the conduction of said switch between said first and second terminals; said first terminal being coupled to said output of said control unit, said second terminal being coupled to said input of said said control device and said second supply voltage being coupled to said control terminal.

* * * * *